(12) United States Patent
Bellman et al.

(10) Patent No.: US 7,575,798 B2
(45) Date of Patent: Aug. 18, 2009

(54) OPTICAL ELEMENT WITH AN OPAQUE CHROME COATING HAVING AN APERTURE AND METHOD OF MAKING SAME

(75) Inventors: Robert A. Bellman, Painted Post, NY (US); Ljerka Ukrainczyk, Painted Post, NY (US); Jose M. Quintal, Campbell, NY (US); Paul A. Sachenik, Corning, NY (US)

(73) Assignee: Corning Incorporated, Corning, NY (US)

( * ) Notice: Subject to any disclaimer, the term of this patent is extended or adjusted under 35 U.S.C. 154(b) by 469 days.

(21) Appl. No.: 11/198,712

(22) Filed: Aug. 5, 2005

(65) Prior Publication Data

US 2006/0088773 A1  Apr. 27, 2006

Related U.S. Application Data

(63) Continuation-in-part of application No. 10/971,611, filed on Oct. 21, 2004, now Pat. No. 7,459,095.

(51) Int. Cl.
*B32B 3/24* (2006.01)

(52) U.S. Cl. .......................... 428/138; 428/209; 430/4; 430/5

(58) Field of Classification Search .................. 428/138, 428/209; 430/4, 5
See application file for complete search history.

(56) References Cited

U.S. PATENT DOCUMENTS

| | | | | |
|---|---|---|---|---|
| 4,139,443 A * | 2/1979 | Sakurai | ............ | 204/192.29 |
| 4,166,148 A * | 8/1979 | Sakurai | ............ | 430/5 |
| 4,178,403 A * | 12/1979 | Sakurai et al. | ............ | 430/5 |
| 4,363,846 A * | 12/1982 | Kaneki | ............ | 428/203 |
| 5,230,971 A | 7/1993 | Aplay et al. | ............ | 430/5 |
| 5,976,639 A | 11/1999 | Iwata et al. | ............ | 428/209 |
| 6,562,549 B2 | 5/2003 | Zemen et al. | ............ | 430/316 |
| 6,635,394 B2 | 10/2003 | Hung | ............ | 430/5 |
| 6,667,837 B1 | 12/2003 | Shockey | ............ | 359/738 |
| 7,160,628 B2 * | 1/2007 | Bellman et al. | ............ | 428/632 |
| 2007/0128527 A1 * | 6/2007 | Chua et al. | ............ | 430/5 |

OTHER PUBLICATIONS

J. D. Rancort, "Optical Thin Films User Handbook", SPIE Opt. Eng. Press, Bellingham, WA (1996) pp. 126-129.

P. Baumeister, "Starting designs for the computer optimization of optical coatings", Appl. Opt. 34(22) 4835 (1995).

(Continued)

*Primary Examiner*—William P Watkins, III
(74) *Attorney, Agent, or Firm*—Walter M. Douglas (57) ABSTRACT

A substrate includes an opaque chrome coating on a surface of the substrate dry-etched to form an aperture, wherein chrome in the aperture is below detectable limit. A method of forming an opaque chrome coating on a substrate includes depositing an initial thickness of the opaque chrome coating on the substrate without ion-assist or with undetectable ion-assist and depositing the remainder of the opaque chrome coating with or without ion-assist. In one embodiment the invention is directed to an apertured optical element having a substrate transmissive to light and an opaque chrome coating on the substrate defining an aperture. Three- and four-layer opaque coatings of various materials are disclosed, including three-layer chrome/chrome oxide/chrome coatings.

19 Claims, 7 Drawing Sheets

OTHER PUBLICATIONS

Y. Huang, et al, "Extended Chamber Matching and Repeatability Study for Chrome Etch," Proceedings of SPIE, vol. 4562, pp. 624-632 (2002).

J.O. Clevenger, et al, "Effect of chamber seasoning on the chrome dry etch process" Proceedings of SPIE vol. 5130, pp. 92-100 (2003).

R. B. Anderson, et al "Study of the role of $Cl_2$, $O_2$, and He in the chrome etch process with optical emission spectroscopy" Proceedings of SPIE, vol. 4889 pp. 641-652(2002).

R.B. Anderson, et al "Improvement of chrome CDU by optimizing focus ring design," Proceedings of SPIE, vol. 5130, No. 1, pp. 264-274 (2003).

M. Mueller, et al, "Dry Etching of Chrome for Photomasks for 100 nm Technology using Chemically Amplified Resist", Proceedings of SPIE vol. 4754, pp. 350-360 (2002).

B. Grenon, "What's wrong with Chromium as a photomask film", Chrome Absorber Workshop, SEMETECH, Feb. 5, 2003.

C. Constantine, "Chrome mask etching: The good, the bad, and the ugly", Chrome Absorber Workshop, SEMETECH, Feb. 2004.

H. Chen, et al, "Multilayer Bottom Antireflective Coating for High Numerical Aperature and Modified Illumination Exposure Systems," Jpn. J. Appl. Physics, vol. 42 (2003) pp. 3737-3742.

* cited by examiner

OPTICAL ELEMENT WITH AN OPAQUE CHROME COATING HAVING AN APERTURE AND METHOD OF MAKING SAME

PRIORITY

This application is a Continuation-in-Part Application claiming the priority and benefit of U.S. application Ser. No. 10/971,611, filed Oct. 21, 2004 now U.S. Pat. No. 7,459,095, and titled "Opaque Chrome Coating Suitable For Etching".

BACKGROUND OF INVENTION

Opaque chrome coating has been used for many years as a low reflectance, opaque aperture coating for optical elements, photomasks, and black matrix for LCD displays. Opaque chrome coating typically has three layers: a very thin chrome (Cr) flash for adhesion to a substrate, followed by a chrome oxide ($CrO_x$) layer for low reflection, followed by a thicker chrome (Cr) layer for opacity. The thickness and composition of the opaque chrome layers are chosen to achieve a desired opacity and low reflectance. Optimal layer composition and thickness may be experimentally determined or derived (P. Baumeister, "Starting designs for the computer optimization of optical coatings," Appl. Opt. 34(22) 4835 (1995)). Carbon and nitrogen are often added to improve the reflectance and etch resistance of some of the layers (e.g., U.S. Pat. No. 5,230,971 issued to Alpay). More complex opaque chrome coating structures are known (e.g., U.S. Pat. No. 5,976,639 issued to Iwata).

Opaque chrome coating layers are usually deposited on a substrate by a physical vapor deposition, typically thermal evaporation, e.g., electron beam evaporation or resistance evaporation, or sputtering. An aperture can be patterned in the opaque chrome coating layers with standard photolithography, either by lift-off or etch-back. Lift-off involves depositing the opaque chrome layers over the patterned resist. Stripping the photoresist in a suitable solvent removes the chrome on top the resist to form the pattern. A less critical structure can easily be patterned by lift-off. However, lift-off is less suitable for applications which require patterns with straight edges. More critical structures are typically patterned by etch-back where resist is patterned over the opaque chrome coating layers. The pattern is transferred to the opaque chrome layers by wet etching, typically with a solution of perchloric acid and cerium ammonium nitrate, or by dry etching with a chlorine and oxygen plasma. Recently, this dry etching process has been adopted in the photomask industry because it permits etching of finer features than wet etching. Dry etching of chrome has been discussed extensively in the literature (Y. Huang et al., "Extended chamber matching and repeatability study for chrome etch," Proc. SPIE-Int. Soc. Opt. Eng., Vol. 4562, pp. 624-632 (2002), J. O. Clevenger et al., "Effect of chamber seasoning on the chrome dry etch process," Proc. SPIE-Int. Soc. Opt. Eng. vol. 5130, no. 92-100 (2003), R. B. Anderson et al., "Study of the role of $Cl_2$, $O_2$, and He in the chrome etch process with optical emission spectroscopy," Proc. SPIE-Int. Soc. Opt. Eng., vol. 4889, pp. 641-652 (2002), R. B. Anderson et al., "Improvement of chrome CDU by optimizing focus ring design," Proc. SPIE-Int. Soc. Opt. Eng. vol. 5130, no. 1, pp. 264-174 (2003), and M. Mueller et al., "Dry etching of chrome for photomasks for 100 nm technology using chemically amplified resist," Proc. SPIE-Int. Soc. Opt. Eng., Vol. 4754, pp. 350-360 (2002)).

One of the most economical methods for depositing opaque chrome coating layers on a substrate is ion-assisted electron beam evaporation. In general, the method involves sequentially generating vapors of chrome (Cr) and chrome oxide ($CrO_x$) using an electron beam evaporator and depositing the vapors on a substrate while bombarding the film growing on the substrate with a low energy ion beam. The ion-assist allows for denser and more uniform films than without ion-assist. The more uniform the films, the more consistent the optical properties of the opaque chrome coating. The denser the films, the more resistant the opaque chrome coating is to cracking and pinhole formation. The ion-assist also minimizes the stress in the films. On the other hand, haze and stain of substrate in an aperture etched in opaque chrome coating layers deposited by ion-assisted electron beam evaporation have been observed. This haze and stain can affect the transmission and reflection properties of the aperture.

SUMMARY OF INVENTION

In one aspect, the invention relates to a substrate which comprises an opaque chrome coating on the substrate dry-etched to form an aperture, wherein chrome in the aperture is below detectable limit.

In another aspect, the invention relates to a method of forming an opaque chrome coating on a substrate which comprises depositing an initial thickness of the opaque chrome coating on the substrate without ion-assist or with undetectable ion-assist and depositing the remainder of the opaque chrome coating with or without ion-assist.

In another aspect, the invention is directed to an apertured optical element having a substrate transmissive to light and an opaque chrome coating on the substrate defining an aperture. In particular, the optical element is a window having a chrome coating whose edge portion adjacent the aperture has an acute angle $\theta$ with respect to the window of less than 15°, preferably an angle $\theta$ in the range of 10° to less than 15°, and more preferably an angle $\theta$ in the range of 10° to less than 14.5°.

Other features and advantages of the invention will be apparent from the following description and the appended claims.

DETAILED DESCRIPTION OF PREFERRED EMBODIMENTS

Figure 1:
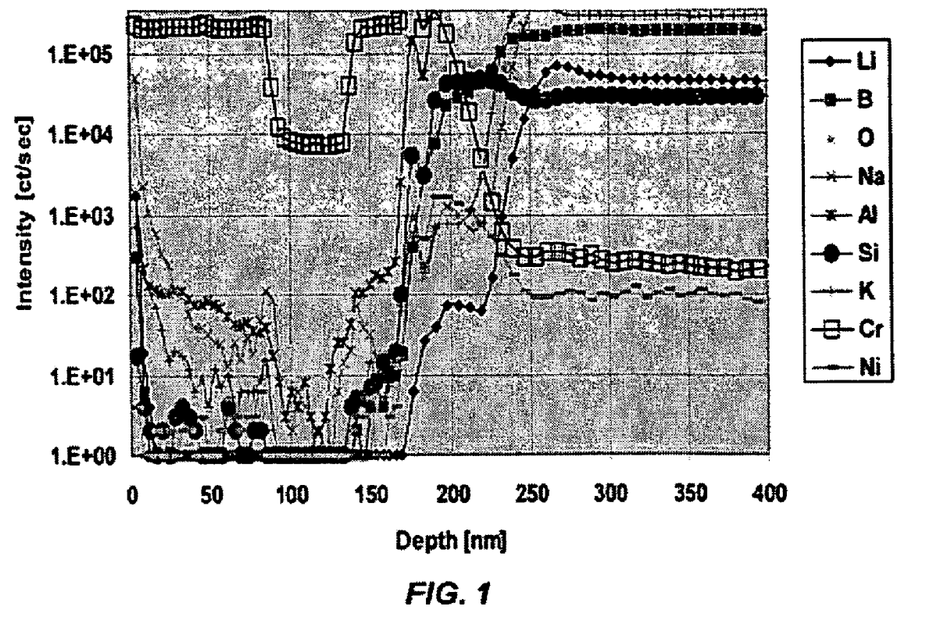
FIG. 1 is a SIMS spectrum of an opaque chrome coating having first two layers deposited with ion-assisted electron beam evaporation.

In a study conducted by the inventors, an opaque chrome coating having a Cr/CrO$_x$/Cr structure was deposited on a glass substrate using ion-assisted electron beam evaporation. The deposition rate for the first two layers was 2 A/s, and filament current at 100 V and 7 A was applied to an ion gun to accelerate argon into the growing film. An aperture was formed in the opaque chrome coating layers by dry etching. However, it was discovered that dry etching could not remove all of the chrome in the aperture. Particles of chrome remained in the aperture after dry etching. The chrome particles led to haze and stain of the glass in the aperture. FIG. 1 shows a SIMS ("Secondary Ion Mass Spectroscopy") spectrum for this example. The SIMS spectra show that chrome appears below the glass/opaque interface when ion-assist is used in depositing the first two layers of the opaque chrome coating.

In view of the above, the inventors have devised a method of depositing opaque chrome coating layers on a substrate such that the opaque chrome coating layers can be fully etched where desirable; leaving an etched area that is substantially free of haze and stain. The method is described below with reference to a few preferred embodiments. In the following description, numerous specific details are set forth in order to provide a thorough understanding of the invention. However, it will be apparent to one skilled in the art that the invention may be practiced without some or all of these specific details. In other instances, well-known features and/or process steps have not been described in detail in order to not unnecessarily obscure the invention. The features and advantages of the invention may be better understood with reference to the drawings and the following discussion.

Figure 2A:
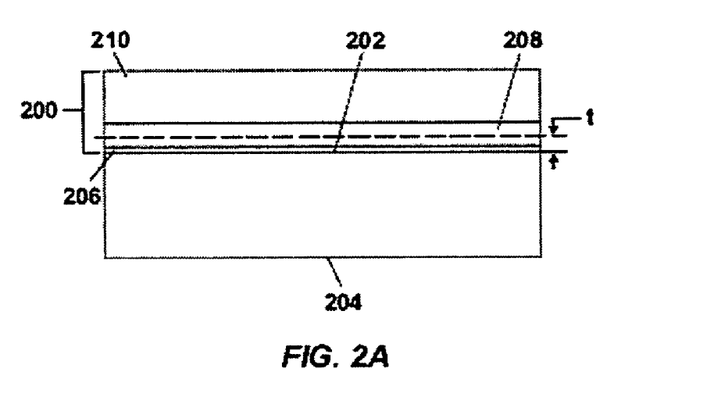
FIG. 2A shows an opaque chrome coating according to an embodiment of the invention.

FIG. 2A shows an opaque chrome coating 200 deposited on a surface 202 of a substrate 204. The substrate 204 may be made of a material that is transparent to light at the wavelengths of interest. Examples of materials for visible light applications are glass and polymer, but the invention is not limited to visible light applications. Prior to depositing the opaque chrome coating 200 on the surface 202, the surface 202 may be coated with an antireflection material and/or patterned photoresist or other desired material. Typically, the opaque chrome coating 200 includes two or more layers, each of which contains either chrome or chrome oxide. The layers may optionally contain elements such as carbon and nitrogen.

In the illustration, the opaque chrome coating 200 has a first layer 206, a second layer 208, and a third layer 210. The thickness and composition of the opaque chrome coating 200 layers may be selected such that the opaque chrome coating 200 has a desired low reflectance, opacity, and adhesion strength. The optimal thickness and composition of the opaque chrome coating 200 layers may be experimentally determined or derived. In one embodiment, the first layer 206 contains chrome (Cr) and has a chrome content greater than 50 at. % (at. %=atomic %), preferably greater than 70 at. %, more preferably greater than 80 at. % and a thickness less than 10 nm. In one embodiment, the second layer 208 contains chrome oxide (CrO$_x$) and has an oxygen content in a range from 35 to 60 at. %, preferably in a range from 40 to 60 at. %, more preferably in a range from 40 to 66 at. % and a thickness in a range from 30 to 52 nm, preferably 34 to 49 nm. In one embodiment, the third layer 210 contains chrome and has a chrome content greater than 80 at. %, preferably greater than 90 at. %, and a thickness of at least 90 µm, preferably 100 nm or greater.

In accordance with an embodiment of the invention, an initial thickness (t) of the opaque chrome coating 200 is deposited without ion-assist or with undetectable ion-assist. In one embodiment, the initial thickness (t) is at least 10 nm, measured from the surface 202 of the substrate 204. Preferably, the initial thickness (t) is at least 30 mm. More preferably, the initial thickness (t) is at least 40 nm.

In one embodiment, ion assist is considered to be undetectable if the ion energies are less than or equal to about 25 V and the current density at the substrate surface 202 is less than or equal to about 0.04 mA/cm$^2$.

Depositing the initial thickness (t) of the opaque chrome coating 200 without ion-assist or with undetectable ion-assist prevents chrome from being encapsulated into the surface of the substrate 204, either due to accelerated ions forward-sputtering chrome on top the surface 202 of the substrate 204 or backward-sputtering substrate material into the chrome being deposited on the substrate 204. The remainder of the opaque chrome coating 200 can be deposited with or without ion-assist. The deposition method used in the initial thickness (t) and the remainder of the opaque chrome coating 200 can be thermal evaporation, e.g., electron beam evaporation or resistive evaporation. Resistive evaporation differs from electron beam evaporation mainly in the manner in which the vapors of coating material are generated. Using the same thermal evaporation method when depositing the initial thickness and the remainder of the opaque chrome coating 200 allows the deposition process to be completed in one vacuum process.

Figure 3:
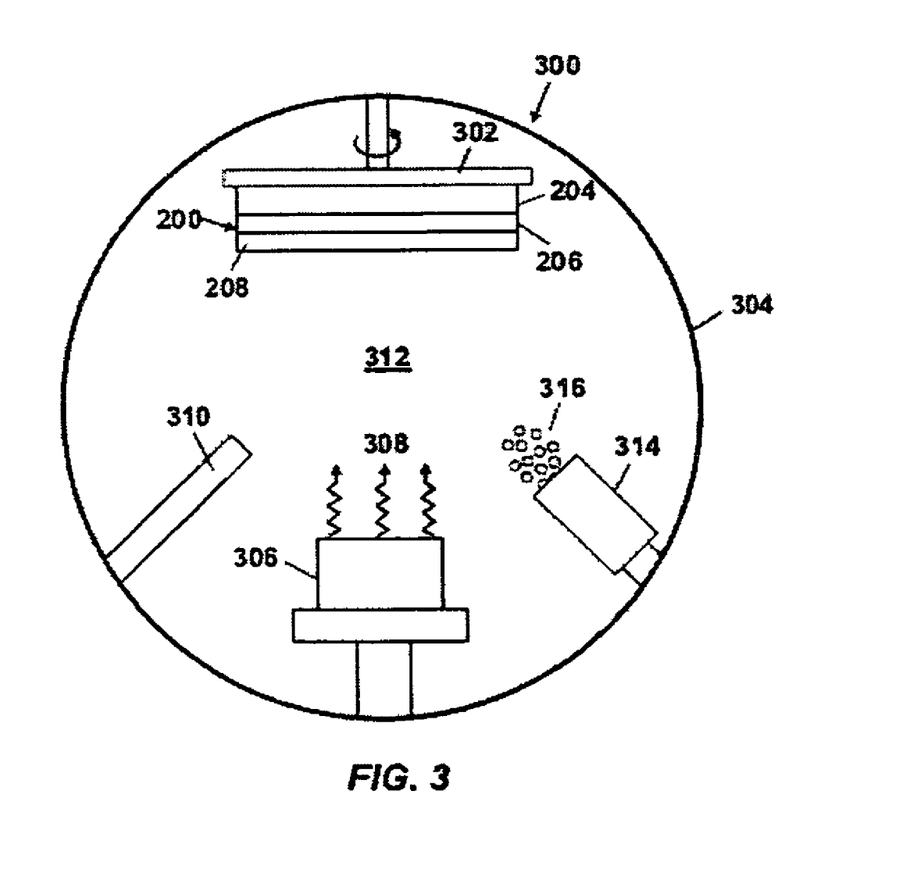
FIG. 3 illustrates a system for depositing opaque chrome coating layers on a substrate.

FIG. 3 illustrates a system 300 for forming the opaque chrome coating 200 on the substrate 204. The system 300 includes a rotatable substrate holder 302 supporting the substrate 204 in a vacuum chamber 304. Below the substrate holder 302 is an electron beam evaporator 306 that uses electron beam to generate vapors 308 from a coating material in a water-cooled crucible (not shown). The electron beam evaporator 306 could include one or more crucibles. The crucible(s) contain a material for forming the layers of the opaque chrome coating 200. The vapors are formed from one crucible at a time. A feedthrough 310 permits reactive gases to enter the chamber 312 above the electron beam evaporator 306. An oxidizing gas such as O$_2$ may be added through feedthrough 310 to react with vapors 308 to form metal oxides such as CrO$_x$. The system 300 also includes an ion source 314, which can bombard the film growing on the substrate 204 when appropriate with ions 316. Typically, the ions 316 are extracted from a plasma.

Figure 2B:
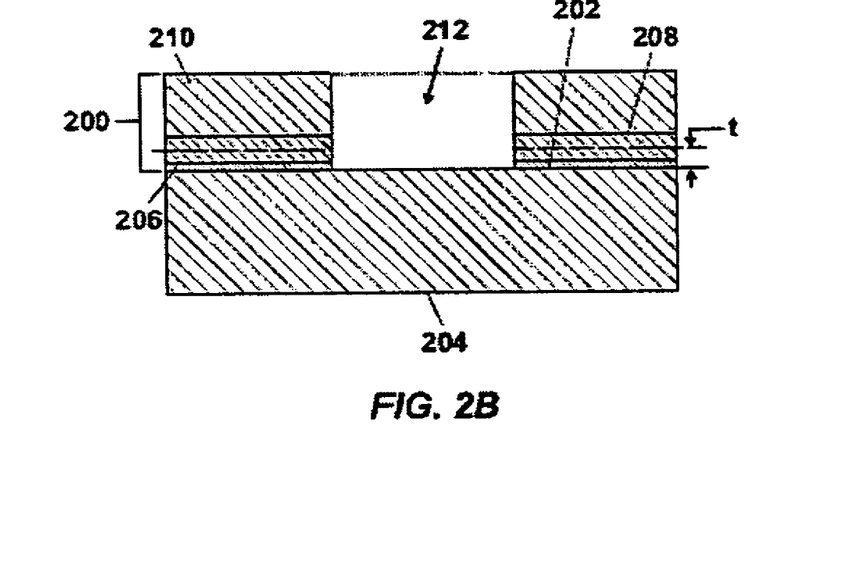
FIG. 2B shows an aperture formed in the opaque chrome coating of FIG. 2A.

FIG. 2B shows an aperture 212 formed in the opaque chrome coating 200. The aperture 212 may be formed in the opaque chrome coating 200 by photolithography. In etch-back photolithography, a photoresist is applied on the opaque chrome coating 200 and patterned with the aperture. The opaque chrome coating 200 is then etched back using the photoresist as a mask. Then, the photoresist is removed from the opaque chrome coating 200. Wet or dry etching can be used to etch-back the opaque chrome coating 200 to form the aperture 212. The etchants are typically selected such that only the opaque chrome coating 100 is etched. The wet etching can be with perchloric acid and cerium ammonium nitrate solution. The dry etching is typically with oxygen and chlorine plasma. Forming an initial thickness (t) of the opaque chrome coating 200 without ion-assist or with undetectable ion-assist allows full etching of the chrome in the aperture 212. In one embodiment, chrome in the aperture 212 is below detectable limit as measured by SIMS and the substrate 204 exposed through the aperture 212 does not exhibit visible haze or stain under bright light illumination.

Figure 4A:
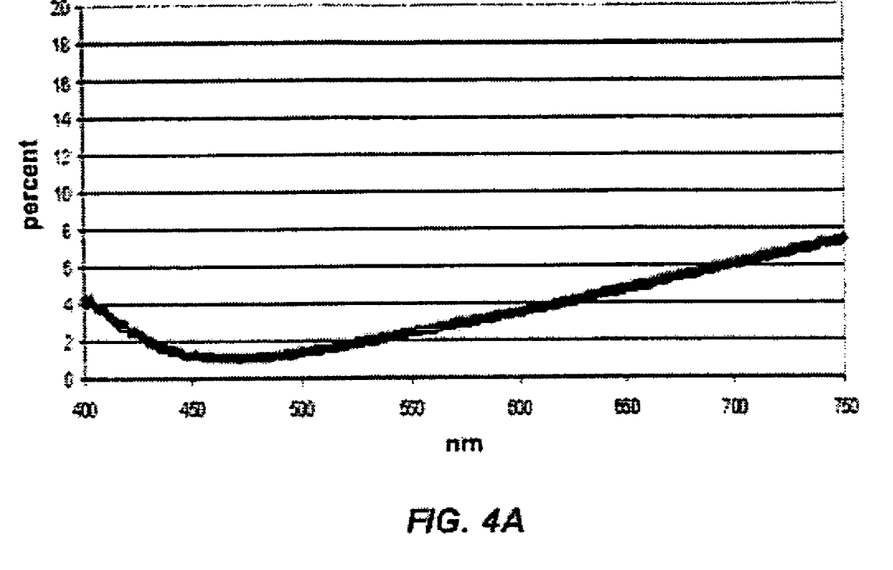
FIG. 4A shows reflectance as a function of wavelength for an opaque chrome coating according to an embodiment of the invention.
Figure 4B:
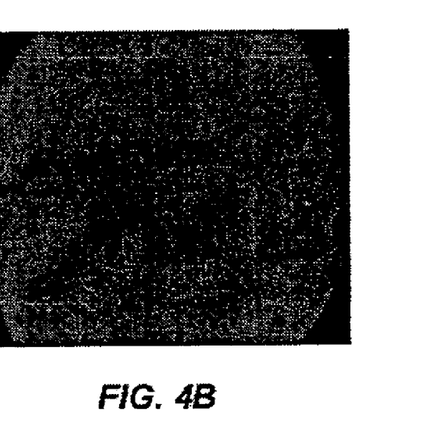
FIG. 4B shows a micrograph of an aperture etched in an opaque chrome coating according to an embodiment of the invention.
Figure 4C:
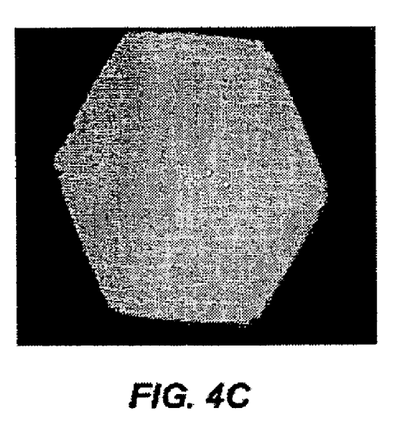
FIG. 4C shows a micrograph of the aperture having the SIMS spectra of FIG. 1.

FIG. 4A shows a reflectance versus wavelength curve for an opaque chrome coating having the structure shown in FIG. 2A. In this example, the first layer 206 contains chrome, has a thickness of 4 nm, and is deposited without ion-assist. The second layer 208 contains chrome oxide, has a thickness of 42 nm, and is deposited without ion-assist. The third layer 210 contains chrome, has a thickness of 120 nm, and is deposited with ion-assist. This produced an opaque chrome coating with an optical density of 3.8 across the visible range (400 to 700 nm). FIG. 4B shows a micrograph of an aperture etched in this opaque chrome coating. The micrograph shows that the aperture is clean after etching when no ion-assist is used in depositing the first two layers. For comparison purposes, FIG. 4C shows a micrograph of the aperture having the SIMS spectra of FIG. 1. The micrograph shows that chrome remains in the aperture when ion-assist is used in depositing the first two layers of the opaque chrome coating.

The invention typically provides the following advantages. Depositing an initial thickness (t) of the opaque chrome coating 200 without ion-assist or with undetectable ion-assist prevents chrome from being encapsulated into the surface of the substrate 204. This ensures that when the opaque chrome coating 200 is etched, substantially all of the chrome in the etched area can be removed, leaving the substrate 202 in the etched area free of haze and stain when observed under visible light illumination. Ion-assist can be used in the remainder of the opaque chrome coating 200 to achieve denser and more uniform films that are more resistant to cracking and pinhole formation and have more consistent optical properties. The same deposition method could be used for all the layers of the opaque chrome coating 200, allowing deposition to be achieved in one vacuum process, which is economical.

Figure 5:
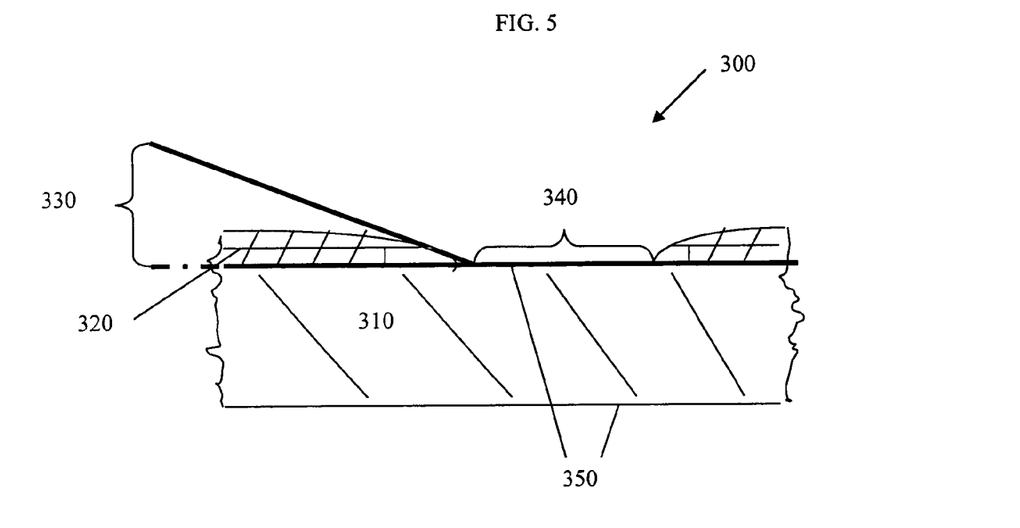
FIG. 5 illustrates an opaque chrome coating on one face of a light transmissive substrate in which the opaque chrome coating has an aperture through it, and the edge portion of the chrome layer adjacent the aperture forms, with respect to the aperture, an acute angle of less than 15°

Referring to FIG. 5, the teachings herein were used to prepare a window/optical element 300 having an opaque chrome coating 320 (cross-hatched areas) on one or both faces 350 of the window (top face coated illustrated) and an aperture 340 within the opaque chrome coating permitting the transmission of light through the window. In particular, the window has an opaque chrome coating whose edge portion adjacent the aperture forms an acute angle 330 with respect to the window of less than 15°, preferably an angle 330 in the range of 10° to less than 15°, and more preferably an angle 330 in the range of 10° to less than 14.5°. The opaque chrome coating comprises a plurality of layers of chrome ("Cr") and/or chrome oxide ("CrO$_x$"), preferably 2-5 layers and more preferably 3 or 4 layers. In all cases, the first layer is a thin chrome layer having a thickness of less than 10 nm. The first layer is used to provide good adhesion to the window. The subsequent layers comprise chrome oxide and chrome layers. In a three layer coating the last layer comprises a chrome layer. The layers are deposited on an optically transmissive substrate 310, for example, a glass suitable for the application in which the optical element will be used. In a 3-layer configuration the opaque coating sequence on the substrate (deposition of layers 1/2/3) is /Cr/CrO$_x$/Cr and in a 4-layer configuration the opaque coating sequence is substrate/Cr/CrO$_x$/Cr/CrO$_x$. The preferred embodiment is the 3-layer opaque chrome coating. (The substrate 310, opaque chrome coating 320, acute angle 330, aperture 340, top and bottom faces 350 and holder 450 are numbered consistently in FIGS. 5-11.)

Figure 6:
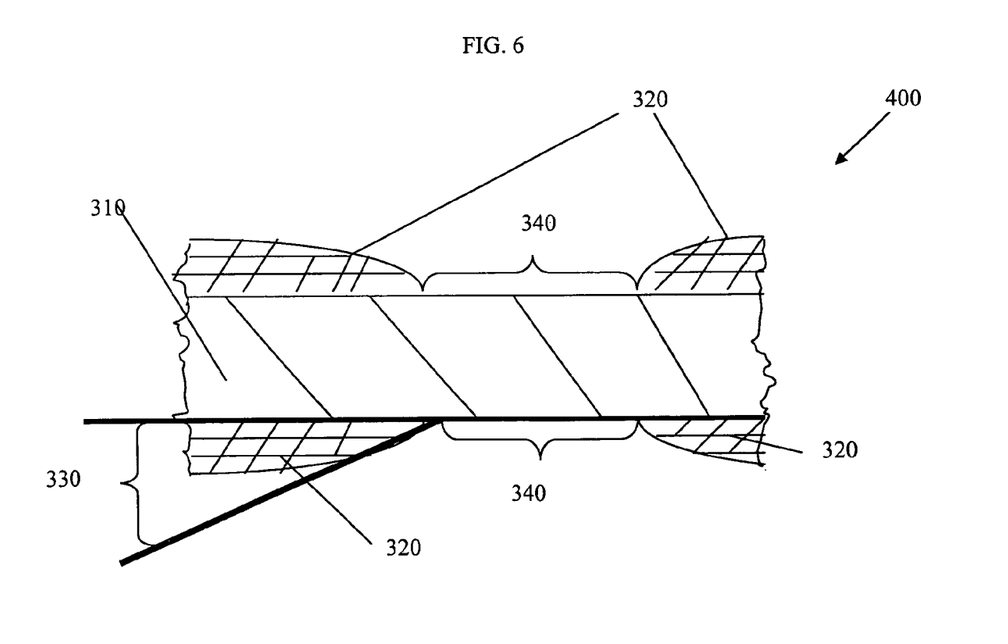
FIG. 6 illustrates an opaque chrome coating on the top and bottom faces of a light transmissive substrate in which the opaque chrome coating has an aperture through it, and the edge portion of the chrome layer adjacent the aperture forms, with respect to the aperture, an acute angle of less than 15°

FIG. 6 illustrates the window/optical element 400 having an opaque coating 320 and an aperture 340 on both faces of the substrate 310. The angle 330 of less than 15°, illustrated in the lower left of FIG. 6, is the same for all edges of the opaque coating 320 in FIGS. 5-11.

Figure 7:
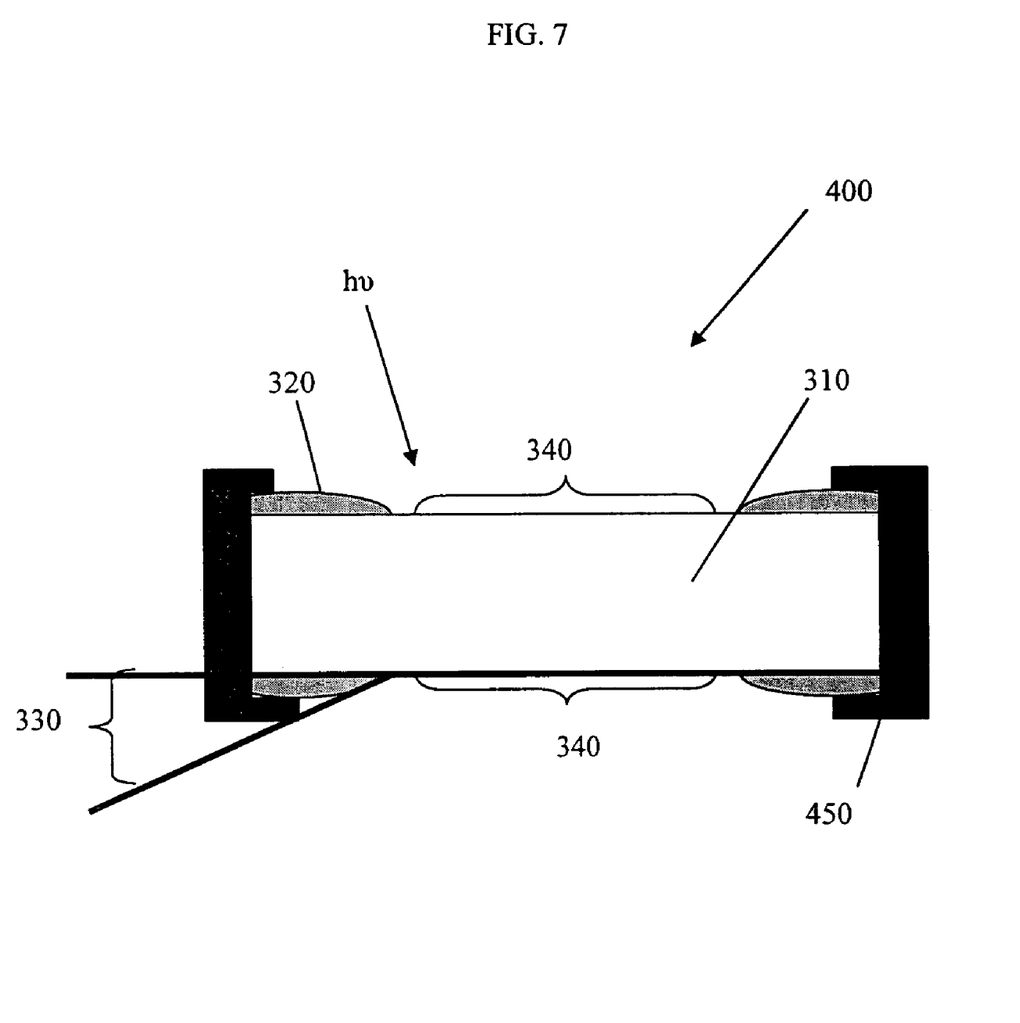
FIG. 7 is a side view illustrating a window having an opaque chrome coated top face and an opaque chrome coated bottom face coating, an aperture in the chrome coating of both faces and a holder about the window.
Figure 11:
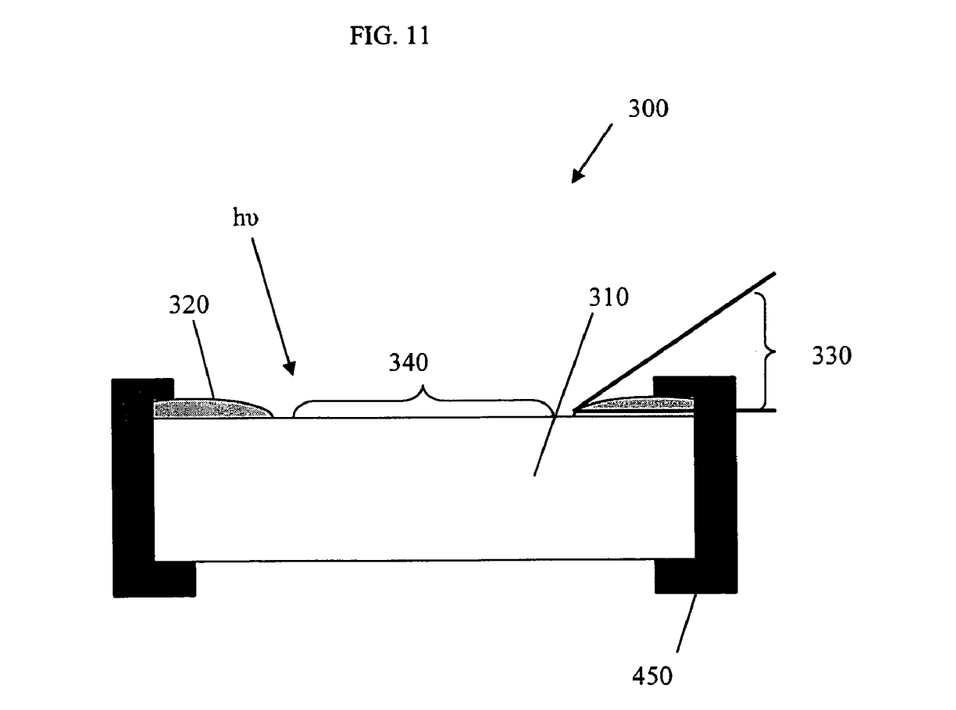
FIG. 11 is a side view illustrating a window having only an opaque chrome coated top face, an aperture in the chrome coating and a holder about the window.

FIG. 7 illustrates a window/optical element 400 having a substrate 310 with opaque coating 320 (light grey) in a holder 450 (dark grey), the opaque coating 320 being on both the top and bottom faces 350. A sealing agent 460 (not illustrated) can be placed between the opaque coating 320 and holder 450. Examples of the sealing agents include metallic indium and alloys thereof, Kovar™, and other sealing agents known in the art. Referring to FIG. 7, incoming light hυ can enter the window 310 at either the top or bottom aperture 240 and exit the window at the other aperture 340. If, after exiting the window, the light hits a reflective element such as a mirror, the path would be reversed. Light traveling in either direction that strikes either the opaque chrome coating 320 or the holder 450 would not pass through window 310. FIG. 11 illustrates a window 300 similar to window 400 of FIG. 7, except that in FIG. 11 the opaque chrome coating is only on the top face 350 as illustrated in FIGS. 5 and 11. When only the top face is coated with the opaque chrome coating the light h) from any source first impinges on this face before passing through the window. Light would then reach any operative element such as a micromirror array (not illustrated) after it exits the bottom face.

Figure 8:
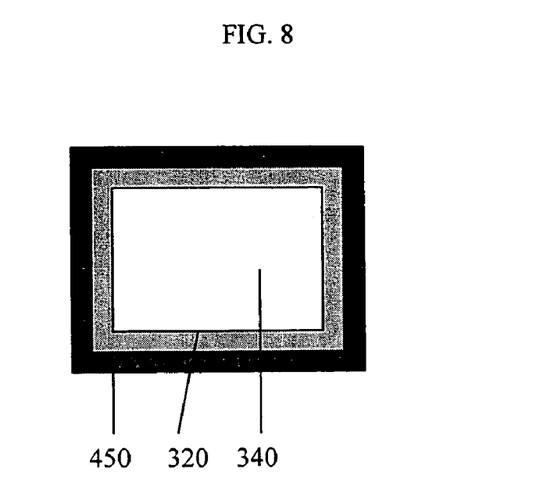
FIG. 8 is a top view of the window of FIG. 7 and/or FIG. 11.

FIG. 8 is a top view of a window/optical element (300 or 400) of FIG. 7 or FIG. 11 illustrating the chrome coating 320, aperture 340 and holder 450. FIG. 8 also illustrates that the holder 450 likewise extends around the entire perimeter, from top face to bottom face, as well as over a portion of the chrome coating. The window of FIG. 11 would look similar when viewed from above the top face.

A window 300 on a substrate 310 was prepared as described herein using a dry etch process to form the aperture. In the process a window substrate 310 was coated with an opaque chrome coating; for example, a Cr/CrO$_x$/Cr coating. The first Cr layer is deposited for adhesion and is deposited without the use of any ion-beam assistance or with undetectable ion-beam assistance to avoid embedding chrome in the substrate. Embedding chrome will affect the optical density ("OD") of the final aperture that is formed. Optical density is defined as $-\log_{10} T$, where T is the measured transmittance through the aperture. For example

| % Transmittance | Optical Density (OD) |
|---|---|
| 100 | 0 |
| 10 | 1 |
| 1 | 2 |
| 0.1 | 3 |

For the aperture through which light must pass, the OD should be zero or as close to zero as possible so that light transmittance is 100% or as close to 100% as possible.

While is important that the optical density of the aperture be a low as possible or in order for light to pass easily through the window's aperture(s) without loss (hence one does not want to embed the first chrome layer deeply into the substrate), it is also important the final opaque coating have a high optical density so that light is absorbed and/or reflected by the coating, including the edges to avoid light scattering and interference patterns that would effect the performance of any optical element using the window. For most uses an opaque coating is one in which OD of the opaque chrome coating is greater than or equal to 3 (OD$\geq$3). Apertured windows 300 and 400, produced as described herein, have an opaque chrome coating with an OD$\geq$3, preferably OD$\geq$3.5, and most preferably OD$\geq$3.8. The chrome and chrome oxide material, and the thickness or the layers, used to prepare a 3-layer opaque chrome coatings with an aperture window are those that have been described herein in Paragraph [0026]. That it, the first layer contains chrome (Cr) and has a chrome content greater than 50 at. %, preferably greater than 70 at. %, more preferably greater than 80 at. % and a thickness less than 10 nm. The second layer contains chrome oxide (CrO$_x$) and has an oxygen content in a range from 35 to 60 at. %, preferably in a range from 40 to 60 at. %, more preferably in a range from 40 to 66 at. % and a thickness in a range from 30 to 52 nm, preferably 34 to 49 nm. The third layer contains chrome and has a chrome content greater than 80 at. %, preferably greater than 90 at. %, and a thickness of at least 90 nm, preferably 100 nm or greater. Alternative materials can also be used. For example, the first layer (the adhesion layer) can be titanium (Ti), aluminum (Al) and tantalum (Ta) in addition to chrome. The second layer can any black metallic oxide that will adhere well to the substrate including (in addition to CrO$_x$) SrTiO$_x$, CoPb, CoMnO$_x$, CoMnFeO$_x$, MnFeO$_x$ and others known in the art. The third layer can include metallic aluminum, nickel (Ni), titanium and tantalum in addition to chrome. In preferred embodiments, the third layer is deposited over the first two layers such that composite layers constituting the opaque coating have and OD$\geq$3, preferably an OD$\geq$3.5, and more preferably an OD$\geq$3.8. A window 400 can similarly be prepared.

Figure 9:
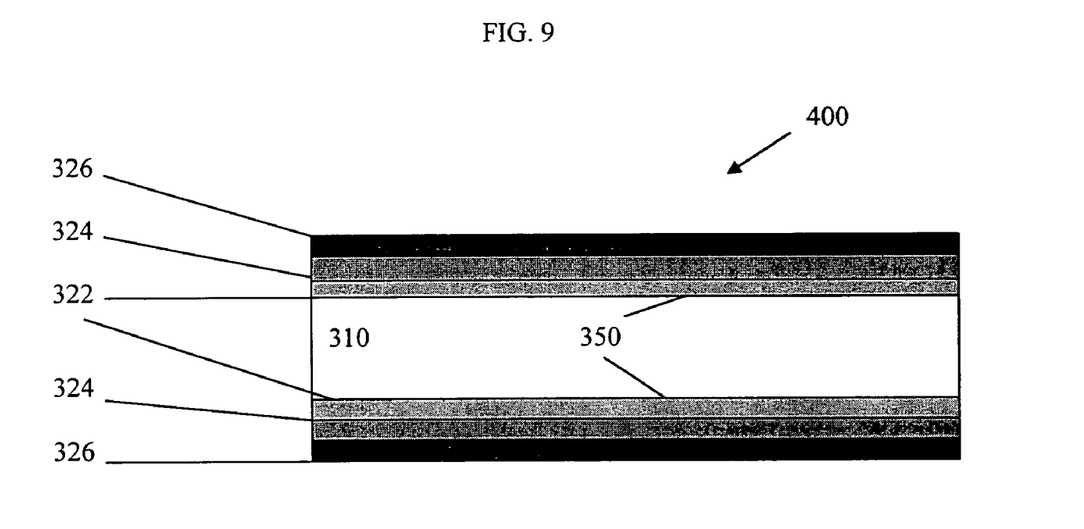
FIG. 9 is a side view of a window having Cr/CrO$_x$/Cr layers on the first or top face and the second or bottom face before formation of an aperture in the Cr/CrO$_x$/Cr layers.
Figure 10:
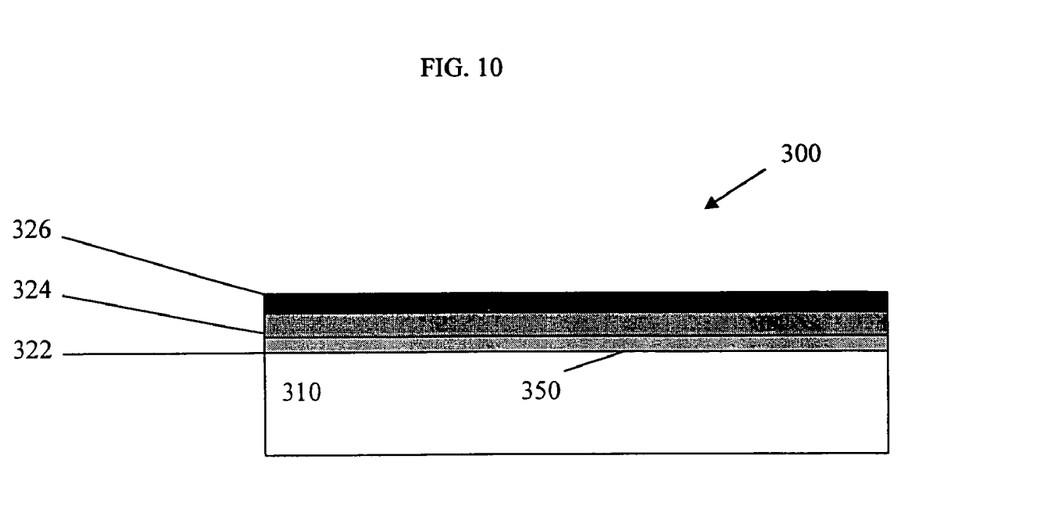
FIG. 10 is a side view of a window having Cr/CrO$_x$/Cr layers on only the first or top face before formation of an aperture in the Cr/CrO$_x$/Cr layers.

A window 300 as described herein, and with particular reference to Paragraphs [0029} to [0033], was prepared as follows. A substrate 310 having a top (upper) face 350 and a bottom (lower) face 350 is illustrated in FIG. 10. Further referring to FIG. 10, a first layer chrome coating 322 (light grey) having a chrome content of greater than 50% chrome was deposited on the top face 350 of substrate 310. The chrome layer 322 was deposited to a thickness of <10 nm. Next, a chrome oxide layer 324 having an oxygen content in the range of 30% to 60% was deposited in top of chrome layer 322. The chrome oxide layer was deposited to a thickness in the range of approximately 32 nm to approximately 50 nm. Both the layers 322 and 324 were deposited without ion-beam assist or with undetectable ion-beam assist to prevent or minimize penetration of chrome and/or chrome oxide into the surface of the substrate. In the next step a chrome layer 326 was deposited on top of chrome oxide layer 324. The deposition was carried out using ion-beam assistance in order to form a more rugged, durable coating by densifying the outermost chrome layer. When applying final chrome layer 326 (or any other final opaque coating layer regardless of material), ion-beam assistance having ion energies greater than 25 V and a current greater than 0.04 mA/cm$^2$ are used. Typical energy and current values are in the range of 50-600 V and 0.075-0.7 mA/cm$^2$, preferably 100$\pm$20 V and 0.17-0.4 mA/cm$^2$. Once all the chrome and chrome oxide layers have been deposited, the aperture was then formed. A window with the opaque chrome coating on both faces 350 is illustrated in FIG. 9.

The aperture was form by first applying a photoresist on top of chrome layer 326. The photoresist can be applied by any method know in the art such as spraying, painting or spinning techniques using a liquid photoresist, or by application of a photoresist "dry film" such as a DuPont Riston® or other films known in the art. A dry film photoresist is preferred and was used in this example. A mask was then used to protect the areas where the aperture is to be formed (that is, the area where the chrome is to be removed to form the aperture), and the photoresist was exposed to light which polymerized the photoresist in the areas not covered by the mask. In the next step the unpolymerized photoresist was stripped to expose the chrome/chrome oxide layers in the aperture area. The exposed chrome/chrome oxide layers were then removed by dry etching using a chlorine/oxygen plasma to form the aperture(s) though which light can enter and exit. After etching, the polymerized photoresist was removed using methods known in the art or as recommended by the photoresist manufacturer. The glass and the opaque chrome coating were then cleaned using methods known in the art and, optionally, an anti-reflective ("AR") coating was then applied to the aperture area. The completed window with the opaque chrome-coated window, with or without the optional anti-reflective coating, was then ready for placement in a holder as illustrated in FIG. 8 or for used as otherwise intended. Windows prepared as described were found to have an acute angle 330 of less than 15°, the angle typically being in the range of 10° to 14.5°, and an opaque coating OD$\geq$3 and typically an OD$\geq$3.5, and especially an OD$\geq$3.8. An apertured window having an opaque coating, as described herein is especially useful in electrooptical elements such as MEMS devices used in digital light projection (DLP) systems. The dry-etching was carried out using a chlorine/oxygen plasma that has a chlorine/oxygen (Cl$_2$/O$_2$) ratio in the range of 8:2 to 5:5, preferably in the range of 7:3 to 6:4. As an example, for Cl$_2$:O$_2$=6:4, the gas feed rates were Cl$_2$ equal to approximately 120 sccm and O$_2$ equal to approximately 80 sccm at a DC bias ~45 V, power density ~0.18 W/cm$^2$; where sccm is standard cubic centimeter per minute. The DC bias range is 0<DC bias$\leq$100 and the power density ("PD") range is 0<PD$\leq$0.3 W/cm$^2$. For a hard etch mask like a SiO$_2$ mask the process involves using either a first wet etch (HF, BOE) or a first dry etch (CF$_4$—O$_2$, CHF$_3$—O$_2$, and similar etching combinations) to remove the SiO$_2$ mask. The photoresist is then removed and is followed by Cl$_2$:O$_2$ dry etch as taught above.

In an addition embodiment, the invention is also directed to an optical element comprising a substrate having a top face and a bottom face and transmissive to light; an opaque coating on one or both of said top face and said bottom face, said opaque coating extending a distance from the edge of a face toward the center a face, said opaque coating thus defining an aperture through which light can be transmitted through said substrate; a housing around the perimeter of said substrate and from the top face to the bottom face and extending along a face for a distance from the edge of the substrate toward the center of a face, but not completely covering the opaque coating on the substrate; and, optionally, a sealing material between said opaque coating and said housing; wherein the edge of the opaque coating chrome layer defining the circumference of the aperture is sloped with respect to the face at an acute angle of less than 15°. The optical element has a three layer opaque coating comprising a first layer adjacent to the substrate face that can be any one of chrome, titanium, tantalum and aluminum; a second layer on top of the first layer, the second layer being a black metallic oxide that can be any one of $CrO_x$, $SrTiO_x$, CoPb, $CoMnO_x$, $CoMnFeO_x$, $MnFeO_x$ and others known in the art; and a third layer on top of said second layer, the third layer being a metallic material that can be any one of metallic aluminum, nickel, titanium, tantalum and chrome. In preferred embodiments the first and third layers are chrome and the second layer is chrome oxide. The first layer is deposited without ion-beam assist or with undetectable ion-bean assist, undetectable ion-beam assist being defined herein. The third layer can be deposited with or without ion-beam assist. In preferred embodiments the third layer is deposited with ion-beam assist, the beam having ion energies greater than 25 V and a current density greater than 0.04 mA/cm$^2$.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An article comprising:
    a substrate;
    an opaque chrome coating having an optical density greater than or equal to 3 formed on a surface of the substrate and etched to form an aperture within the coating,
    wherein chrome in the aperture is below detectable limit and the edge of the chrome coating defining the circumference of the aperture is sloped at an acute angle in a range from 10° to less than 15°.

2. The article of claim 1, wherein the opaque chrome coating comprises a first layer comprising chrome, a second layer comprising chrome oxide, and a third layer comprising chrome.

3. The article of claim 2, wherein a thickness of the first layer is less than 10 nm and the chrome content of the first layer is greater than 50%.

4. The article of claim 2, wherein a thickness of the second layer is in a range from approximately 30 to 52 nm and an oxygen content of the second layer is in a range from 35 to 60 at. %.

5. The article of claim 3, wherein a thickness of the third layer is at least 90 nm and a chrome content of the third layer is greater than approximately 80 at. %.

6. The article according to claim 4 wherein said third layer is a densified layer produced during deposition by use of ion-beam assistance.

7. The article according to claim 1, wherein the opaque chrome coating has an optical density greater or equal to 3.8.

8. The article according to claim 1, wherein the opaque chrome coating first layer is 4-6 nm thick, the second layer is approximately 40-45 nm thick and the third layer is 100-110 nm thick.

9. The article according to claim 2, wherein the third layer is a densified layer, the densification resulting from the use of ion-beam assistance during application of the third layer, the ion-beam having an ion energy in the range of 50-600 V and a current density in the range of 0.17-0.4 mA/cm$^2$.

10. The article according to claim 2, wherein said coating further comprises a fourth layer, said fourth layer being chrome oxide, and said coating is etched to form an aperture within said coating, and said fourth layer is a densified layer, the densification resulting from the use of ion-beam assistance during application of the third layer, the ion-beam having an ion energy in the range of 50-600 V and a current density in the range of 0.17-0.4 mA/cm$^2$.

11. A window comprising:
    an opaque chrome coating dry-etched to form an aperture within the coating, the opaque chrome coating having an optical density greater than or equal to 3,
    wherein chrome in the aperture is below detectable limit and the edge of the chrome layer defining the circumference of the aperture is sloped at an acute angle in a range from 10° to less than 15°.

12. The window of claim 11, wherein the opaque chrome coating comprises a first layer comprising chrome, a second layer comprising chrome oxide, and a third layer comprising chrome.

13. The window of claim 11, wherein a thickness of the first layer is less than 10 nm and the chrome content of the first layer is greater than 50 at. %.

14. The window of claim 11, wherein a thickness of the second layer is in a range from approximately 30 to 52 nm and an oxygen content of the second layer is in a range from 35 to 60 at. %.

15. The window of claim 12, wherein a thickness of the third layer is at least 90 nm and a chrome content of the third layer is greater than approximately 80 at. %.

16. The window according to claim 13 wherein said third layer is a densified layer produced during deposition by use of ion-beam assistance.

17. The window according to claim 11, wherein the opaque chrome coating has an optical density greater or equal to 3.8.

18. The window according to claim 12, wherein the opaque chrome coating first layer is approximately 4-6 nm thick, the second layer is approximately 40-45 nm thick and the third layer is approximately 100-110 nm thick.

19. The window according to claim 12, wherein the third layer is a densified layer, the densification resulting from the use of ion-beam assistance during application of the third layer, the ion-beam having an ion energy in the range of 50-600 V and a current density in the range of 0.17-0.4 mA/cm$^2$.

* * * * *